United States Patent
Park et al.

(10) Patent No.: US 11,329,169 B2
(45) Date of Patent: May 10, 2022

(54) MULTI-NEGATIVE DIFFERENTIAL TRANSCONDUCTANCE DEVICE AND METHOD OF PRODUCING THE SAME

(71) Applicant: Research & Business Foundation Sungkyunkwan University, Suwon-si (KR)

(72) Inventors: Jin-Hong Park, Hwaseong-si (KR); Jae-Woong Choi, Suwon-si (KR); Kwan-Ho Kim, Busan (KR); Maksim Andreev, Suwon-si (KR)

(73) Assignee: Research & Business Foundation Sungkyunkwan University, Suwon-si (KR)

( * ) Notice: Subject to any disclaimer, the term of this patent is extended or adjusted under 35 U.S.C. 154(b) by 0 days.

(21) Appl. No.: 17/071,170

(22) Filed: Oct. 15, 2020

(65) Prior Publication Data

US 2021/0111283 A1    Apr. 15, 2021

(30) Foreign Application Priority Data

Oct. 15, 2019 (KR) .......................... 10-2019-0127835

(51) Int. Cl.
*H01L 29/786* (2006.01)
*H01L 51/05* (2006.01)
(Continued)

(52) U.S. Cl.
CPC ...... *H01L 29/78696* (2013.01); *H01L 29/267* (2013.01); *H01L 29/42368* (2013.01);
(Continued)

(58) Field of Classification Search
CPC ............ H01L 29/78696; H01L 29/267; H01L 29/42368; H01L 29/4908; H01L 29/518;
(Continued)

(56) References Cited

U.S. PATENT DOCUMENTS

| | | | |
|---|---|---|---|
| 6,291,865 B1 * | 9/2001 | Lee | H01L 21/28167 |
| | | | 257/410 |
| 2002/0096690 A1 | 7/2002 | Nemati et al. | |

(Continued)

OTHER PUBLICATIONS

Lim, Ji-Hye, et al., "Double Negative Differential Transconductance Characteristic: From Device to Circuit Application toward Quaternary Inverter." *Advanced Functional Materials*, 29, 48, 2019 (pp. 1-8).
Korean Office Action dated Oct. 29, 2020 in counterpart Korean Patent Application No. 10-2019-0127835 (6 pages in Korean).

*Primary Examiner* — Tong-Ho Kim
(74) *Attorney, Agent, or Firm* — NSIP Law

(57) ABSTRACT

A multi-negative differential transconductance device includes a substrate conductive portion; a gate insulating layer formed by being laminated on the substrate conductive portion; a first semiconductor, a second semiconductor, and a third semiconductor which have different threshold voltages and are formed to be horizontally connected in series on the gate insulating layer; and an electrode formed at both ends of the first semiconductor and the third semiconductor. The multi-negative differential transconductance device forms a junction of three or more semiconductor materials in one device to have a plurality of peaks and valleys so that the multi-negative differential transconductance device is utilized to implement a multi-valued logic circuit which is capable of representing four or more logical states without significantly increasing an area of the negative differential transconductance device which occupies the chip. Therefore, effects of low power consumption, a reduced size, and high speed of a chip may be achieved.

11 Claims, 7 Drawing Sheets

(51) Int. Cl.
*H01L 29/49* (2006.01)
*H01L 29/267* (2006.01)
*H01L 29/51* (2006.01)
*H01L 29/423* (2006.01)
*H01L 29/66* (2006.01)
*H01L 29/739* (2006.01)
*H01L 29/24* (2006.01)
*H01L 29/45* (2006.01)

(52) U.S. Cl.
CPC ........ *H01L 29/4908* (2013.01); *H01L 29/518* (2013.01); *H01L 29/66325* (2013.01); *H01L 29/66742* (2013.01); *H01L 29/66969* (2013.01); *H01L 29/7393* (2013.01); *H01L 51/0562* (2013.01); *H01L 29/24* (2013.01); *H01L 29/45* (2013.01)

(58) Field of Classification Search
CPC ......... H01L 29/66325; H01L 29/66742; H01L 29/66969; H01L 29/7393; H01L 29/24; H01L 29/45; H01L 51/0562
USPC .......................................................... 257/40
See application file for complete search history.

(56) References Cited

U.S. PATENT DOCUMENTS

2002/0119637 A1* 8/2002 Bertin ................. H01L 21/2822
438/423
2019/0296145 A1* 9/2019 Huang ................. H01L 29/1054

\* cited by examiner

[FIG. 1A]
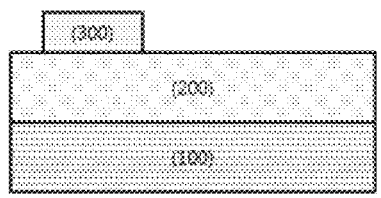
[FIG. 1B]
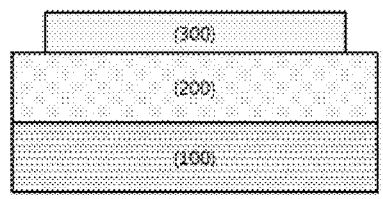
[FIG. 2A]
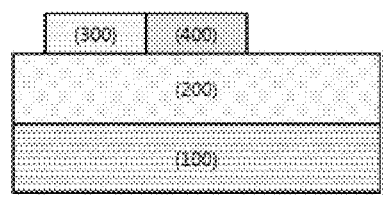
[FIG. 2B]
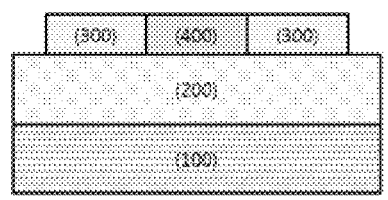
[FIG. 3]
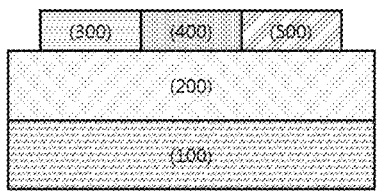

[FIG. 4]
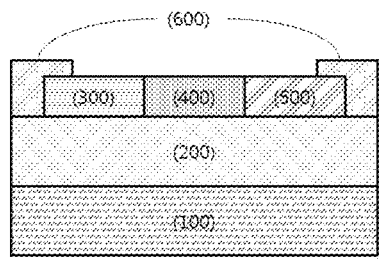
[FIG. 5]
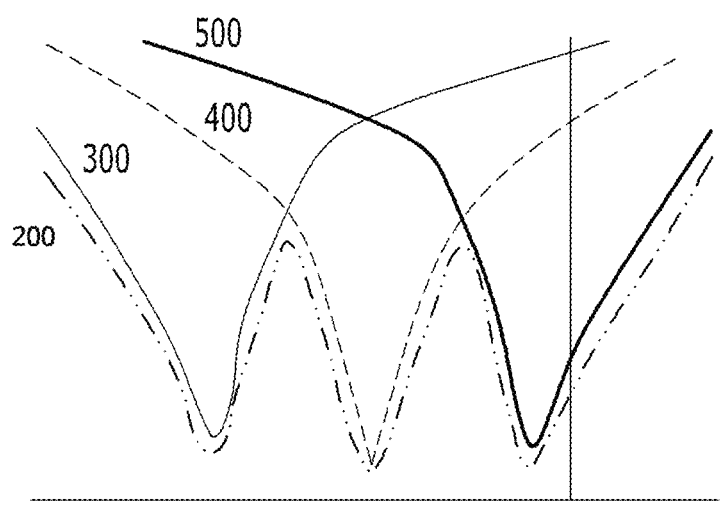
[FIG. 6A]
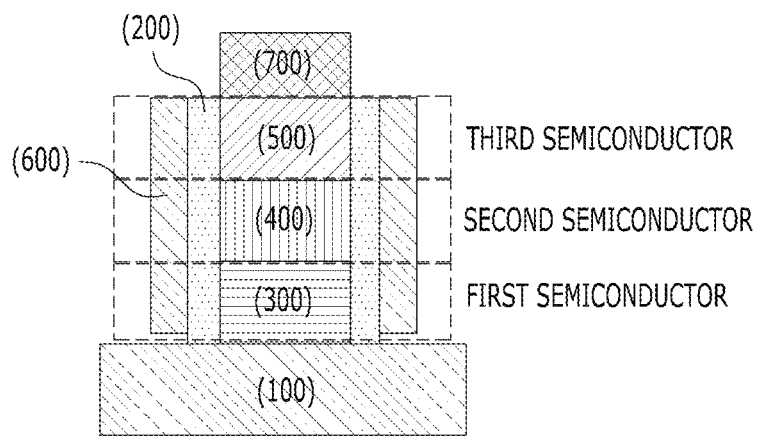

[FIG. 6B]
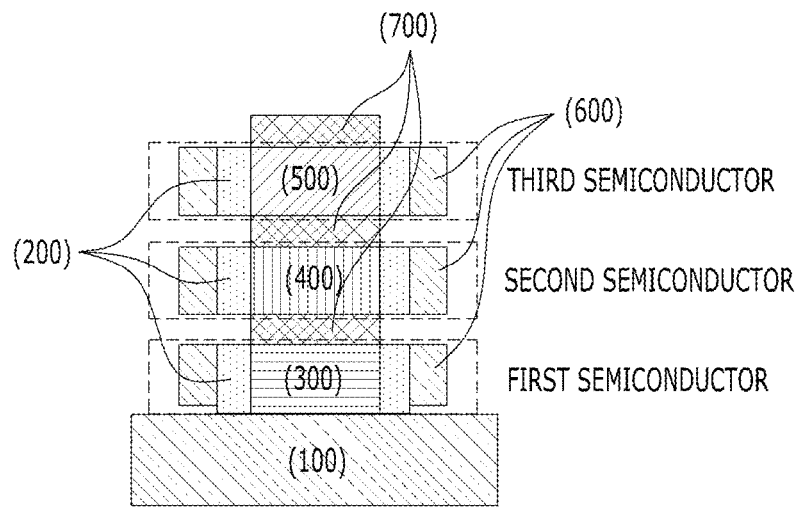
[FIG. 7A]
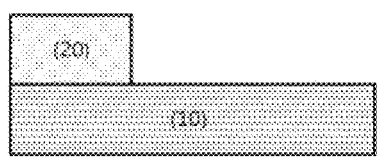
[FIG. 7B]
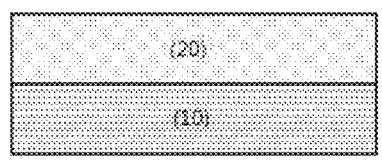
[FIG. 8A]
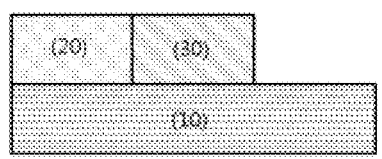
[FIG. 8B]
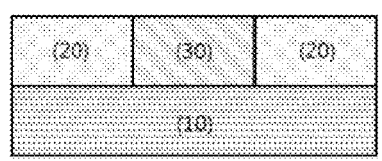

[FIG. 9]
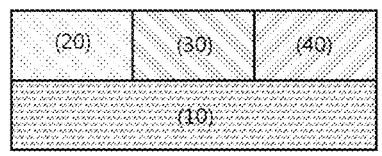
[FIG. 10]
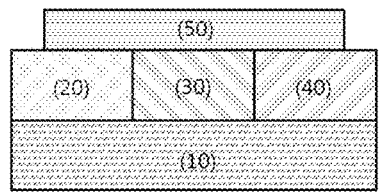
[FIG. 11]
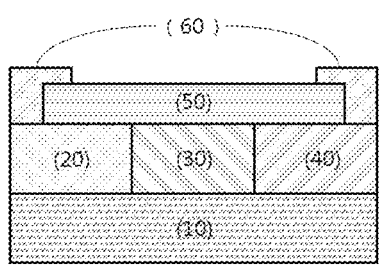
[FIG. 12A]
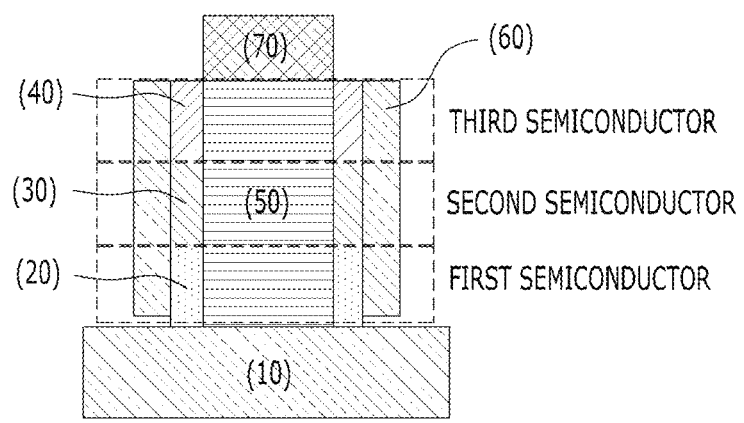

[FIG. 12B]
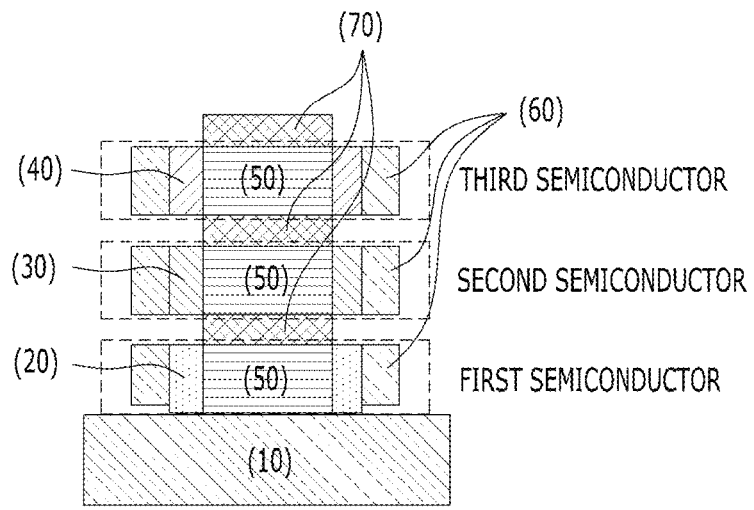
[FIG. 13]
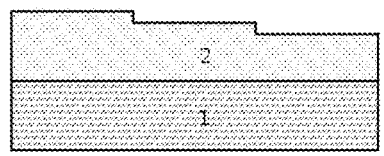
[FIG. 14]
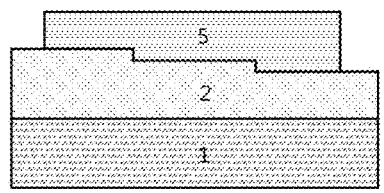
[FIG. 15]
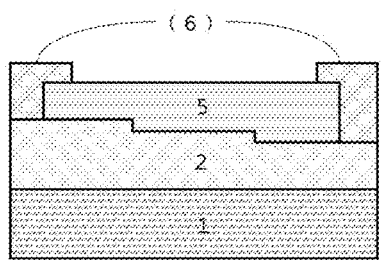

[FIG. 16A]
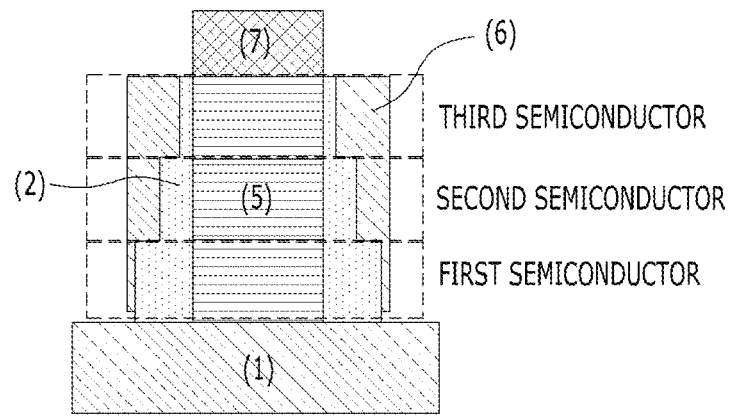
[FIG. 16B]
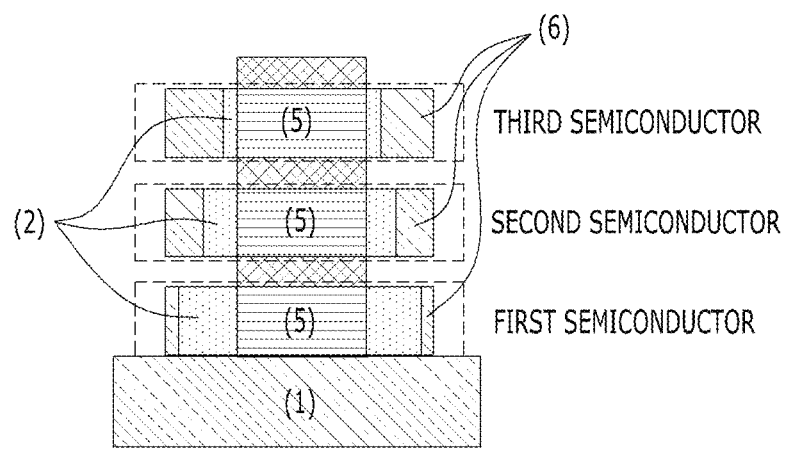
[Fig. 17]
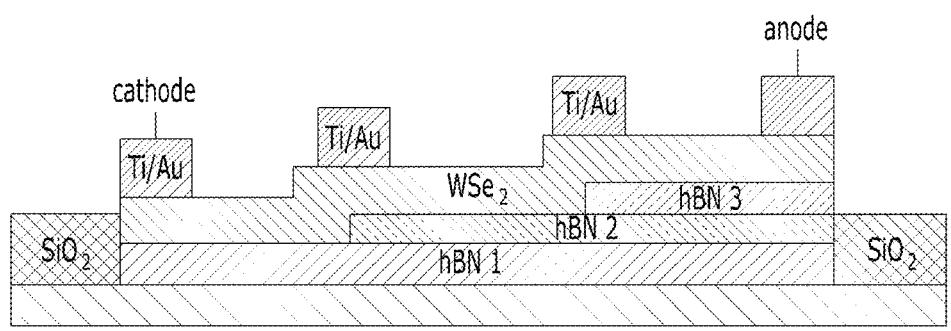

[Fig. 18]
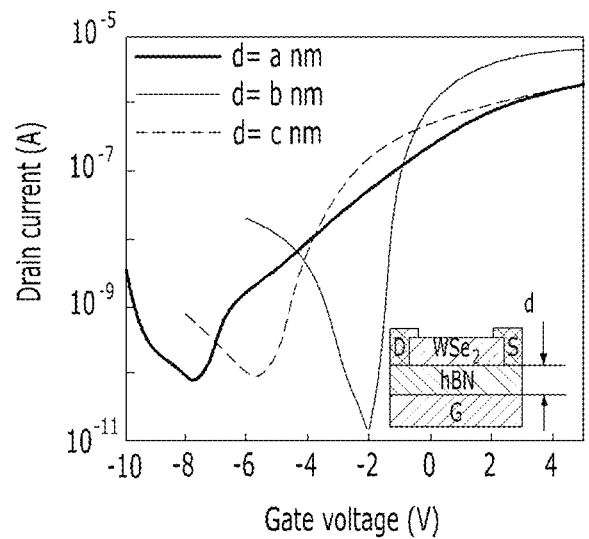
[FIG. 19]
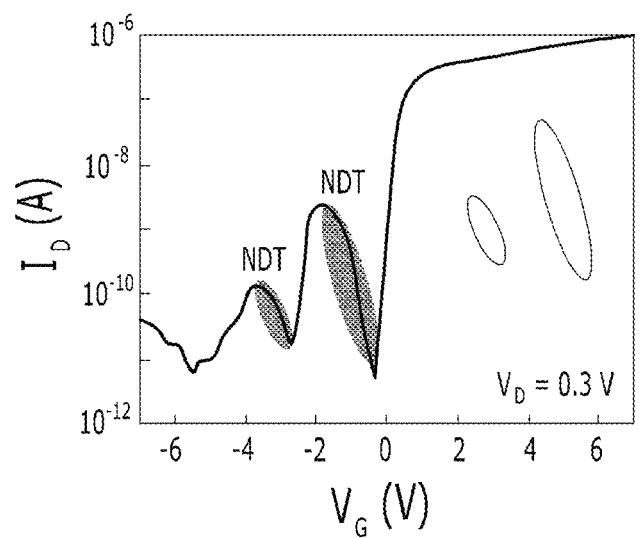

MULTI-NEGATIVE DIFFERENTIAL TRANSCONDUCTANCE DEVICE AND METHOD OF PRODUCING THE SAME

CROSS-REFERENCE TO RELATED APPLICATIONS

This application claims the priority of Korean Patent Application No. 10-2019-0127835 filed on Oct. 15, 2019, in the Korean Intellectual Property Office, the disclosure of which is incorporated herein by reference.

BACKGROUND

Field

The present disclosure relates to a method of producing a multi-negative differential transconductance device, and more particularly, to a method of producing a multi-negative differential transconductance (NDT) device having a plurality of peaks and valleys by serial junctions of three or more ambipolar semiconductors having different threshold voltages.

Description of the Related Art

In the negative differential transconductance device, the current decreases despite the increase in the gate voltage, so that a gate voltage-drain current characteristic curve is shown as an "N" shape.

Such a negative differential transconductance device is generally known as being observed in a heavily doped p-n-p or n-p-n junction structure, a resonant tunneling transistor (RTT), or a single electron transistor (SET).

In the heavily doped p-n-p or n-p-n structure, when a gate voltage is applied to an n-region or a p-region, an interband tunneling section is reduced so that the negative differential transconductance characteristic is implemented.

However, this structure has a problem in that the current is consistently increased after passing a section where the current decreases so that only a single peak and valley is implemented.

An RTT structure and a SET structure are structures in which a quantum well is formed between a source and a drain using nanowire and quantum dots. This structure adjusts a position of a quantized energy level in the quantum well by a gate voltage to form a peak current so that the NDT may be implemented.

However, there is a problem in that due to a device size of several nano scales, the process is complex, and it operates only at a low temperature.

In order to overcome the above-mentioned problems, a channel layer conductivity of the n-type and p-type semiconductor materials or an energy barrier of a junction surface is adjusted by bonding an n-type semiconductor material and a p-type semiconductor material to implement an NDT phenomenon. However, it is confirmed that there is a new problem in that this structure implements only a single peak and valley.

RELATED ART DOCUMENT

Patent Document

US Publication No. US 20020096690 (2002.07.25)

SUMMARY

In order to solve the above-described problems, an object of the present disclosure is to provide a method of producing a multi-negative differential transconductance device which has a plurality of peaks and valleys by 1) using semiconductors with different band structures, 2) adjusting a permittivity of a gate dielectric layer, 3) adjusting a thickness of a gate dielectric layer to generate a plurality of threshold voltages in a single semiconductor device or connecting devices with different threshold voltages.

In order to achieve the above-described object, a multi-negative differential transconductance device according to the present disclosure includes a substrate conductive portion; a gate insulating layer formed by being laminated on the substrate conductive portion; first, second, and third semiconductors which have different threshold voltages and are formed to be horizontally connected in series on the gate insulating layer; and an electrode formed at both ends of the first semiconductor and the third semiconductor.

Further, in order to achieve the above-described object, a multi-negative differential transconductance device according to the present disclosure includes a substrate conductive portion; first, second, and third insulating layers which have different dielectric constants and are formed by being horizontally connected in series on the substrate conductive portion; an ambipolar semiconductor formed by being laminated on the first, second, and third insulating layers; and an electrode formed at both ends of the ambipolar semiconductor.

Further, in order to achieve the above-described object, a multi-negative differential transconductance device according to the present disclosure includes a substrate conductive portion; an insulating layer formed on the substrate conductive portion to have different thicknesses by forming steps in three or more sections; an ambipolar semiconductor formed with different thicknesses above the insulating layer by forming steps corresponding to the insulating layer; and an electrode formed at both ends of the ambipolar semiconductor.

Further, in order to achieve the above-described object, a multi-negative differential transconductance device according to the present disclosure includes a substrate conductive portion; first, second, and third semiconductors which have different threshold voltages and are formed to be vertically laminated in this order on the substrate conductive portion; a gate insulating layer formed so as to at least partially or entirely enclose the first, second, and third semiconductors which are laminated; a gate electrode formed so as to at least partially or entirely enclose the gate insulating layer; and an anode formed on the third semiconductor.

Further, in order to achieve the above-described object, a multi-negative differential transconductance device according to the present disclosure includes a substrate conductive portion; an ambipolar semiconductor vertically (longitudinally) formed on the substrate conductive portion; first, second, and third insulating layers with different dielectric constants which are formed at all or a part of a side surface of the ambipolar semiconductor; an electrode formed so as to at least partially or entirely enclose the side surfaces of the first, second, and third insulating layers; and an anode formed on the ambipolar semiconductor.

Further, in order to achieve the above-described object, a multi-negative differential transconductance device according to the present disclosure includes a substrate conductive portion; an ambipolar semiconductor vertically (longitudinally) formed on the substrate conductive portion; an insulating layer formed in all or at least a part of a side surface of the ambipolar semiconductor; an electrode formed so as to at least partially or entirely enclose a side surface of the insulating layer with a structure corresponding to the insulator; and an anode formed on the ambipolar semiconductor.

Further, in order to achieve the above-described object, the electrode of the multi-negative differential transconductance device according to the present disclosure uses, for the p-type semiconductor, a metal having a high work function, such as platinum (Pt) or palladium (Pd) to lower a contact resistance, and for the n-type semiconductor, uses a metal having a low work function, such as titanium (Ti) or aluminum (Al).

Further, in order to achieve the above-described object, the electrode of the multi-negative differential transconductance device according to the present disclosure is formed by thermal evaporation, e-beam evaporation, sputtering, or chemical vapor deposition.

Further, in order to achieve the above-described object, the insulating layer of the multi-negative differential transconductance device according to the present disclosure is formed by any one process of thermal evaporation, e-beam evaporation, sputtering, chemical vapor deposition, physical vapor deposition, and oxidation.

Further, in order to achieve the above-described object, the first semiconductor, the second semiconductor, and the third semiconductor of the multi-negative differential transconductance device according to the present disclosure are formed with various thickness of several nm to several hundreds of μm and may be silicon, germanium, group III-V semiconductor, oxide semiconductor, organic semiconductor, transition metal dichalcogenide, phosphorene, or semiconductor materials operating as a p-type, an n-type, or an ambipolar semiconductor.

Further, in order to achieve the above-described object, the silicon, the germanium, the group III-V semiconductors, the oxide semiconductors, and organic semiconductors of the multi-negative differential transconductance device according to the present disclosure are formed using thermal evaporation, e-beam evaporation, sputtering, chemical vapor deposition, or spin coating.

Further, in order to achieve the above-described object, the transition metal dichalcogenide or phosphorene of the multi-negative differential transconductance device according to the present disclosure is exfoliated using a tape, grown using chemical vapor deposition (CVD), or obtained using an impregnation of a chalcogen element in a transition metal.

Further, in order to achieve the above-described object, the first semiconductor, the second semiconductor, and the third semiconductor of the multi-negative differential transconductance device according to the present disclosure have a common conductivity range.

Further, in order to achieve the above-described object, the insulating layer of the multi-negative differential transconductance device according to the present disclosure has a thickness which decreases from the lower portion to the upper portion to be stepped so that the thickness varies depending on the position.

Further, in order to achieve the above-described object, the thickness of the insulating layer of the multi-negative differential transconductance device according to the present disclosure is adjusted by varying a growing time for every section of the insulating layer, dry etching using plasma, or wet etching using etchant.

Further, in order to achieve the above-described object, in the multi-negative differential transconductance device according to the present disclosure, the anode electrode is formed between the first semiconductor and the second semiconductor and between the second semiconductor and the third semiconductor.

Further, in order to achieve the above-described object, in the multi-negative differential transconductance device according to the present disclosure, the anode electrode is formed between the ambipolar semiconductors enclosed by the first insulating layer and the second insulating layer and between the ambipolar semiconductors enclosed by the second insulating layer and the third insulating layer.

Further, in order to achieve the above-described object, in the multi-negative differential transconductance device according to the present disclosure, the anode electrode is formed between the ambipolar semiconductors in which the insulating layer or the electrodes has different thicknesses.

A multi-negative differential transconductance device produced by a method according to the present disclosure forms a junction of three or more semiconductor materials in one device to have a plurality of peaks and valleys to be utilized to implement a multi-valued logic circuit which is capable of representing four or more logical states (for example, when one transistor is connected to one multi-negative differential transconductance device, a quaternary inverter or a quaternary memory is implemented) without significantly increasing an area of the negative differential transconductance device which occupies the chip. Therefore, effects of low power consumption, a reduced size, and high speed of a chip may be achieved.

BRIEF DESCRIPTION OF DRAWINGS

The above and other aspects, features and other advantages of the present disclosure will be more clearly understood from the following detailed description taken in conjunction with the accompanying drawings, in which:

FIGS. 1A to 4 are views for explaining a method of producing a multi-negative differential transconductance device of a first embodiment according to the present disclosure;

FIG. 5 is a graph for explaining a current-voltage characteristic of a multi-negative differential transconductance device according to the present disclosure;

FIGS. 6A and 6B are views for explaining a method of producing a multi-negative differential transconductance device of a second embodiment according to the present disclosure;

FIGS. 7A to 11 are views for explaining a method of producing a multi-negative differential transconductance device of a third embodiment according to the present disclosure;

FIGS. 12A and 12B are views for explaining a method of producing a multi-negative differential transconductance device of a fourth embodiment according to the present disclosure;

FIGS. 13 to 15 are views for explaining a method of producing a multi-negative differential transconductance device of a fifth embodiment according to the present disclosure;

FIGS. 16A and 16B are views for explaining a method of producing a multi-negative differential transconductance device of a sixth embodiment according to the present disclosure;

FIG. 17 is a view illustrating a multi-negative differential transconductance device according to the present disclosure in which a threshold voltage of a partial section of a tungsten diselenide channel is changed using a difference in a thickness of a hexagonal boron nitride insulating layer;

FIG. 18 is a graph of a channel current characteristic according to a gate voltage on a hexagonal boron nitride insulating layer with different thicknesses; and FIG. 19 is a graph of a negative differential transconductance characteristic in a gate voltage section.

DETAILED DESCRIPTION OF THE EMBODIMENT

Those skilled in the art may make various modifications to the present invention and the present invention may have various embodiments thereof, and thus specific embodiments will be illustrated in the drawings and described in detail in detailed description. However, this does not limit the present invention within specific exemplary embodiments, and it should be understood that the present invention covers all the modifications, equivalents and replacements within the spirit and technical scope of the present invention. In the description of respective drawings, similar reference numerals designate similar elements.

It should be understood that, when it is described that an element is "coupled" or "connected" to another element, the element may be directly coupled or directly connected to the other element or coupled or connected to the other element through a third element. In contrast, when it is described that an element is "directly coupled" or "directly connected" to another element, it should be understood that no element is not present therebetween.

Terms used in the present application are used only to describe a specific exemplary embodiment, but are not intended to limit the present invention. A singular form may include a plural form if there is no clearly opposite meaning in the context. In the present application, it should be understood that term "include" or "have" indicates that a feature, a number, a step, an operation, a component, a part or the combination those of described in the specification is present, but do not exclude a possibility of presence or addition of one or more other features, numbers, steps, operations, components, parts or combinations, in advance.

If it is not contrarily defined, all terms used herein including technological or scientific terms have the same meaning as those generally understood by a person with ordinary skill in the art. Terms defined in generally used dictionary shall be construed that they have meanings matching those in the context of a related art, and shall not be construed in ideal or excessively formal meanings unless they are clearly defined in the present application.

Hereinafter, a method of producing a multi-negative differential transconductance device will be described with reference to the accompanying drawings.

First, as a first embodiment, a method of producing a multi-negative differential transconductance device according to the present disclosure will be described with reference to FIG. 1A to 4.

As illustrated in FIGS. 1A and 1B, a substrate is formed such that a gate insulating layer 200 is laminated on a substrate conductive portion 100.

A first step of the method of producing a multi-negative differential transconductance device according to the present disclosure is a step of forming a first semiconductor 300 on the gate insulating layer 200 which configures the substrate with a structure as illustrated in FIG. 1A or 1B.

Here, the substrate may be a substrate which is widely used in a semiconductor process, such as silicon (Si) or germanium (Ge) or a substrate in which an insulating layer 200 such as silicon dioxide (SiO2), aluminum oxide (Al2O3), or hafnium oxide (HfO2) is grown or deposited on the substrate conductive portion 100 such as gold (Au), platinum (Pt), or copper (Cu).

The first semiconductor 300 may be formed with various thicknesses of several nm to several hundreds of μm and use any of semiconductor materials operating as a p-type, an n-type, or an ambipolar semiconductor, such as silicon, germanium, group III-V semiconductors, oxide semiconductors, organic semiconductors, transition metal dichalcogenide, or phosphorene.

The silicon, the germanium, the group III-V semiconductors, the oxide semiconductors, and the organic semiconductors may be formed using thermal evaporation, e-beam evaporation, sputtering, chemical vapor deposition, or spin coating.

A two-dimensional semiconductor material such as transition metal dichalcogenide or phosphorene may be grown using an exfoliation method using a tape, chemical vapor deposition such as a CVD, or an impregnation method using a chalcogen element in a transition metal.

A second step of the method of producing a multi-negative differential transconductance device according to the present disclosure is formed by a step of forming a second semiconductor 400 to be in contact with the first semiconductor 300 as illustrated in FIG. 2A or forming a second semiconductor 400 in a part of the first semiconductor 300 as illustrated in FIG. 2B.

Similarly to the first semiconductor 300, the second semiconductor 400 may be formed with various thicknesses of several nm to several hundreds of μm and use any of semiconductor materials operating as an ambipolar semiconductor, such as silicon, germanium, group III-V semiconductors, oxide semiconductors, organic semiconductors, or transition metal dichalcogenide.

The first semiconductor 300 and the second semiconductor 400 have different threshold voltages and have a common high conductivity range.

Next, a third step of the method of producing a multi-negative differential transconductance device according to the present disclosure is formed by a step of forming a third semiconductor 500 to be in contact with the second semiconductor 400 as illustrated in FIG. 3.

Similarly to the first semiconductor 300 and the second semiconductor 400, the third semiconductor 500 may be formed with various thicknesses of several nm to several hundreds of μm and use any of semiconductor materials operating as a p-type, an n-type, or an ambipolar semiconductor, such as silicon, germanium, group III-V semiconductor, oxide semiconductor, organic semiconductor, transition metal dichalcogenide, or phosphorene.

As a method for forming the second and third semiconductors 400 and 500, the process of the first step, ion implantation or diffusion, movement of electrons or holes on a surface by forming a film (surface charge transfer doping), plasma doping, or chemical doping may be used.

The second semiconductor 400 and the third semiconductor 500 have different threshold voltages and have a common high conductivity range and the common conductivity range of the second semiconductor 400 and the third semiconductor 500 may be formed in a different section from the common conductivity range formed by the first semiconductor 300 and the second semiconductor 400.

The orders of the process of the first, second, and third semiconductors as described above may be switched.

Finally, a fourth step of the method of producing a multi-negative differential transconductance device according to the present disclosure is formed by a step of forming electrodes at both ends of the device, as illustrated in FIG. 4.

As the electrode 600, in order to lower a contact resistance, for the p-type semiconductor, a metal having a high work function, such as platinum (Pt) or palladium (Pd), may be used and for the n-type semiconductor, a metal having a low work function, such as titanium (Ti) or aluminum (Al) may be used. In the meantime, platinum, palladium, titanium, and aluminum disclosed in the present disclosure are just one of materials proposed in the present disclosure to lower the contact resistance so that the scope of the present disclosure should not be limited to the above-mentioned material. That is, the material may be appropriately changed depending on the necessity of the designer.

The method of depositing the electrode 600 may include thermal evaporation, e-beam evaporation, sputtering, or chemical vapor deposition. In the meantime, the structure of the multi-negative differential transconductance device disclosed in the present disclosure is not limited to the structure illustrated in FIGS. 1A to 4. For example, in the structure described above, a position where the electrode, the insulating layer, and the semiconductor are formed may be opposite (that is, a top gate structure may be formed).

When a power is applied to the electrode 600, the multi-negative differential transconductance device produced by the method as described above has a channel current characteristic in accordance with a gate voltage, as illustrated in FIG. 5.

That is, when the voltage is applied to the electrode 600, in accordance with the increase of the gate voltage, in the first semiconductor 300, the current gradually decreases to have a minimum value at a predetermined voltage and then increases to draw a V-shaped curve (a number 300 curve) in a specific section.

Further, in the second semiconductor 400, the current also gradually decreases to have a minimum value at a predetermined voltage and then increases to draw a V-shaped curve (a number 400 curve) in a specific section different from that of the first semiconductor 300.

Further, in the third semiconductor 500, the current also gradually decreases to have a minimum value at a predetermined voltage and then increases to draw a V-shaped curve (a number 500 curve) in a specific section different from those of the first and second semiconductors 300 and 400.

It is possible to implement a multi-negative differential transconductance device having a plurality of peaks and valleys like a number 200 curve formed by selectively connecting small current values from the first to third semiconductor devices 300, 400, and 500 connected in series.

As described above, the first to third semiconductor devices 300, 400, and 500 draw V-shaped curves in different sections due to different threshold voltages of the devices.

As a second embodiment, another method of producing a multi-negative differential transconductance device according to the present disclosure will be described with reference to FIGS. 6A and 6B.

A first step of the method of producing a multi-negative differential transconductance device according to the present embodiment is a step of vertically laminating first, second, and third semiconductors 300, 400, and 500 with different threshold voltages on the substrate conductive portion 100 in this order, as described in FIG. 6A.

In this case, the first semiconductor 300 is an n-type or an ambipolar semiconductor and the third semiconductor 500 is a p-type or an ambipolar semiconductor.

Next, a second step of the method of producing a multi-negative differential transconductance device according to the present embodiment is a step of forming a gate insulating layer 200 so as to at least partially or entirely enclose side surfaces of the first, second, and third semiconductors 300, 400, and 500 which are formed by being vertically laminated.

Next, a third step of the method of producing a multi-negative differential transconductance device according to the present embodiment is a step of forming an electrode 600 so as to at least partially or entirely enclose an external part of the gate insulating layer 200.

Finally, a fourth step of the method of producing a multi-negative differential transconductance device according to the present embodiment is a step of forming an anode 700 on the third semiconductor 500 with a material which is capable of being used for an electrode, such as a metal, an ultra-heavily doped semiconductor, or graphene.

In this case, as illustrated in FIG. 6B, the anode 700 electrode may also be formed between the first semiconductor 300 and the second semiconductor 400 and between the second semiconductor 400 and the third semiconductor 500.

As a third embodiment, a method of producing a multi-negative differential transconductance device according to the present disclosure will be described with reference to FIGS. 7A to 11.

The method is configured by first, second, and third steps of forming first, second, third insulating layers 20, 30, and 40 with different dielectric constants on a substrate conductive portion 10.

To be more specific, a first step of the method of producing a multi-negative differential transconductance device according to the present disclosure is a step of forming a first insulating layer 20 on the substrate conductive portion 10, as illustrated in FIG. 7A or 7B.

Next, a second step of the method of producing a multi-negative differential transconductance device according to the present disclosure is a step of forming a second insulating layer 30 to be in contact with the first insulating layer 20 as illustrated in FIG. 8A or forming the second insulating layer 30 in a part of the first insulating layer 20 as illustrated in FIG. 8B.

Next, a third step of the method of producing a multi-negative differential transconductance device according to the present disclosure is a step of forming a third insulating layer 40 so as to be in contact with the second insulating layer 30 as illustrated in FIG. 9 or forming the third insulating layer in a part of the first insulating layer 20.

As described above, as a method of forming the insulating layers 20, 30, and 40 with different dielectric constants on the substrate conductive portion 10, different insulating materials are formed to be in contact therewith for every section or as illustrated in FIG. 9, insulating layers 30 and 40 with different dielectric constants may be formed above a part of one type of insulating layer 20 as illustrated in FIG. 7A.

As a process for forming the insulating layers 20, 30, and 40, thermal evaporation, e-beam evaporation, sputtering, chemical vapor deposition, physical vapor deposition, or oxidation may be used.

Next, a fourth step of the method of producing a multi-negative differential transconductance device according to the present disclosure is a step of forming an ambipolar semiconductor 50 above the insulating layers 20, 30, and 40 formed on the substrate conductive portion 10 as illustrated in FIG. 10.

The ambipolar semiconductor 50 is formed above the insulating layers 20, 30, and 40 with different dielectric constants by a method described in the first step of the first embodiment.

The ambipolar semiconductor 50 on the insulating layers 20, 30, and 40 with different dielectric constants needs to have two or more sections having different threshold voltages due to the different dielectric constants of the first, second, and third insulating layers 20, 30, and 40 and a common high conductivity.

As a final step of the third embodiment, a fifth step of the method of producing a multi-negative differential transconductance device according to the present disclosure is a step of forming electrodes 60 at both ends of the device as illustrated in FIG. 11 which is the same as the step of forming the electrodes 600 in the first embodiment. In the meantime, the structure of the multi-negative differential transconductance device disclosed in the present disclosure is not limited to the structure illustrated in FIGS. 7A to 11. For example, in the structure described above, a position where the electrode, the insulating layer, and the semiconductor are formed may be opposite (that is, a top gate structure may be formed).

As a fourth embodiment, another method of producing a multi-negative differential transconductance device according to the present disclosure will be described with reference to FIGS. 12A and 12B.

A first step of a method of producing a multi-negative differential transconductance device according to the present embodiment is a step of vertically (longitudinally) forming an ambipolar semiconductor 50 on the substrate conductive portion 10 as illustrated in FIG. 12A.

The substrate conductive portion 10 may be configured by any material which is capable of being used for an electrode, such as a metal, an ultra-heavily doped semiconductor, or graphene, as a cathode electrode.

Next, a second step of the method of producing a multi-negative differential transconductance device according to the present embodiment is a step of forming the first, second, and third insulating layers 20, 30, and 40 with different dielectric constants in this order in all or a part of the side surface of the ambipolar semiconductor 50 vertically formed.

Next, a third step of the method of producing a multi-negative differential transconductance device according to the present embodiment is a step of forming an electrode 60 so as to at least partially or entirely enclose side surfaces of the first, second, and third insulating layers 20, 30, and 40.

Finally, a fourth step of the method of producing a multi-negative differential transconductance device according to the present embodiment is a step of forming an anode 70 on the ambipolar semiconductor 50 with a material which is capable of being used for an electrode, such as a metal, an ultra-heavily doped semiconductor, or graphene.

In this case, as illustrated in FIG. 12B, the anode electrodes 70 may also be formed between the ambipolar semiconductors 50 enclosed by the first insulating layer 20 and the second insulating layers 30 and between the ambipolar semiconductors 50 enclosed by the second insulating layer 30 and the third insulating layers 40.

As a fifth embodiment, a method of producing a multi-negative differential transconductance device according to the present disclosure will be described with reference to FIGS. 13 to 15.

A first step of a method of producing a multi-negative differential transconductance device according to the present disclosure is a step of forming an insulating layer 2 with different thicknesses by forming steps in three or more sections on the substrate conductive portion 1.

In order to adjust the thickness of the insulating layer 2, a growing time may vary for every section of the insulating layer or dry etching using plasma or wet etching using etchant may be used.

Next, a second step of the method of producing a multi-negative differential transconductance device according to the present disclosure is a step of forming an ambipolar semiconductor 5 above the insulating layer 2, as illustrated in FIG. 14.

The ambipolar semiconductor 5 may be formed by the same method as the first step of the first embodiment, but have steps corresponding to the insulating layer 2 to have different thicknesses.

The ambipolar semiconductor 5 on the insulating layer 2 with different thicknesses needs to have two or more sections having different threshold voltages due to the difference in the thickness of the insulating layer 2 and have a common high conductivity.

As a final step of the fifth embodiment, a third step of the method of producing a multi-negative differential transconductance device according to the present disclosure is a step of forming electrodes 6 at both ends of the device.

The third step of the fifth embodiment of forming the electrodes 6 is the same as the step of forming the electrodes 600 in the first embodiment and the step of forming the electrode 60 in the third embodiment.

As a sixth embodiment, another method of producing a multi-negative differential transconductance device according to the present disclosure will be described with reference to FIGS. 16A and 16B.

A first step of a method of producing a multi-negative differential transconductance device according to the present embodiment is a step of vertically (longitudinally) forming an ambipolar semiconductor 5 on the substrate conductive portion 1 as illustrated in FIG. 16A.

Next, a second step of the method of producing a multi-negative differential transconductance device according to the present embodiment is a step of forming the insulating layer 2 in at least a part or all of the side surface of the ambipolar semiconductor 5 which is vertically formed.

In this case, the insulating layer 2 has a thickness which decreases from a lower portion to an upper portion to be stepped so that the insulating layer 2 has different thicknesses depending on the positions.

Next, a third step of the method of producing a multi-negative differential transconductance device according to the present embodiment is a step of forming an electrode 6 so as to at least partially or entirely enclose side surfaces of the insulating layer 2 with a stepped structure corresponding to the insulator 2.

In this case, the electrode 6 may have a thickness which increases from the lower portion to the upper portion to have a stepped structure corresponding to the insulator 2.

Finally, a fourth step of the method of producing a multi-negative differential transconductance device according to the present embodiment is a step of forming an anode 7 on the ambipolar semiconductor 5 with a material which is capable of being used for an electrode, such as a metal, an ultra-heavily doped semiconductor, or graphene.

In this case, as illustrated in FIG. 16B, the anode 7 electrode may be formed between ambipolar semiconductors 5 in which the insulating layer 2 or the electrode 6 has different thicknesses.

In the meantime, a device which implemented the negative differential transconductance characteristic by forming a hexagonal boron nitride (hBN) insulating layer with different thicknesses for every section below a tungsten diselenide channel to change a threshold voltage for every section was used as an example.

The multi-negative differential transconductance device in which a threshold voltage of a partial section of a tungsten diselenide channel is changed using a thickness difference of the hexagonal boron nitride insulating layer has a structure as illustrated in FIG. 17. However, FIG. 17 illustrates a structure of a characteristic device according to an embodiment of the present disclosure so that the scope of the present disclosure is not limited thereto. For example, in the structure of FIG. 17, the cathode may be substituted with an anode and the anode may be substituted with a cathode.

The tungsten diselenide transistor has a channel current characteristic according to a gate voltage as illustrated in FIG. 18 on the hexagonal boron nitride insulating layer with different thicknesses.

As illustrated in FIG. 18, an absolute value of the threshold voltage of the tungsten diselenide device increases as the thickness of the hexagonal boron nitride insulating layer increases (c<b<a). When devices in which the hexagonal boron nitride insulating layer has different thicknesses are connected in series, only a current in a section with a lowest conductivity flows so that in a section with a voltage which is higher than −5V, sections having a high conductivity overlap. Therefore, when the device is produced as illustrated in FIG. 18, a current characteristic as illustrated in FIG. 19 is obtained.

The voltage changed to −0.2 V, −2.6 V, and −5.5 V. In the above-described device, a high current value was obtained only in a section in which channel layer conductivities of two insulating layers with different structures are commonly high and the negative differential transconductance characteristic was observed in a gate voltage range of −3.8 V to −2.6 V and −1.9 V to −0.3 V. As described above, it was confirmed that the negative differential transconductance device could be implemented by adjusting a threshold voltage using a thickness change in the insulating layer of a partial section of the semiconductor channel.

It will be appreciated that various exemplary embodiments of the present invention have been described herein for purposes of illustration, and that various modifications, changes, and substitutions may be made by those skilled in the art without departing from the scope and spirit of the present invention. Accordingly, the exemplary embodiments disclosed herein are intended to not limit but describe the technical spirit of the present invention and the scope of the technical spirit of the present invention is not restricted by the exemplary embodiments. The protective scope of the present disclosure should be construed based on the following claims, and all the technical concepts in the equivalent scope thereof should be construed as falling within the scope of the present disclosure.

What is claimed is:

1. A multi-negative differential transconductance device, comprising:
   a substrate conductive portion;
   a gate insulating layer formed by being laminated on the substrate conductive portion;
   a first semiconductor, a second semiconductor, and a third semiconductor which have different threshold voltages and are formed to be horizontally connected in series on the gate insulating layer, each of the first, second and third semiconductors being in direct contact with the gate insulating layer; and
   an electrode formed at both ends of the first semiconductor and the third semiconductor,
   wherein the first and second semiconductors have a common conductivity range.

2. The multi-negative differential transconductance device according to claim 1, wherein the electrode uses, for a p-type semiconductor, a metal having a high work function, such as platinum (Pt) or palladium (Pd), and for an n-type semiconductor, uses a metal having a low work function, such as titanium (Ti) or aluminum (Al), to lower a contact resistance.

3. The multi-negative differential transconductance device according to claim 2, wherein the electrode is formed by thermal evaporation, e-beam evaporation, sputtering, or chemical vapor deposition.

4. The multi-negative differential transconductance device according to claim 1, wherein the insulating layer is formed by any one process of thermal evaporation, e-beam evaporation, sputtering, chemical vapor deposition, physical vapor deposition, and oxidation.

5. The multi-negative differential transconductance device according to claim 1, wherein the first semiconductor, the second semiconductor, and the third semiconductor are formed with various thickness of several nm to several hundreds of μm, and are silicon, germanium, group III-V semiconductor, oxide semiconductor, organic semiconductor, transition metal dichalcogenide, phosphorene, or semiconductor materials operating as a p-type, an n-type, or an ambipolar semiconductor.

6. The multi-negative differential transconductance device according to claim 5, wherein the silicon, the germanium, the group III-V semiconductors, the oxide semiconductors, or organic semiconductors are formed using thermal evaporation, e-beam evaporation, sputtering, chemical vapor deposition, or spin coating.

7. The multi-negative differential transconductance device according to claim 5, wherein the transition metal dichalcogenide or phosphorene is exfoliated using a tape, grown using chemical vapor deposition (CVD), or obtained using an impregnation of a chalcogen element in a transition metal.

8. The multi-negative differential transconductance device according to claim 5, wherein the first semiconductor, the second semiconductor, and the third semiconductor have a common conductivity range.

9. A multi-negative differential transconductance device, comprising:
   a substrate conductive portion;
   a first insulating layer, a second insulating layer, and a third insulating layer which have different dielectric constants from each other and are formed by being horizontally connected in series on the substrate conductive portion;
   an ambipolar semiconductor formed by being laminated on the first, second, and third insulating layers; and
   an electrode formed at both ends of the ambipolar semiconductor and in direct contact with the first and third insulating layers.

10. A multi-negative differential transconductance device, comprising:
a substrate conductive portion;
an insulating layer formed on the substrate conductive portion to have different thicknesses by forming steps in three or more sections and formed in order of thickness;
an ambipolar semiconductor formed with different thicknesses above the insulating layer by forming steps corresponding to the insulating layer; and
an electrode formed at both ends of the ambipolar semiconductor,
wherein the ambipolar semiconductor formed on the insulating layer has sections having different threshold voltages due to the different thicknesses of the insulating layer, and has a common conductivity.

11. The multi-negative differential transconductance device according to claim 10, wherein the thicknesses of the insulating layer are adjusted by varying a growing time for every section of the insulating layer, dry etching using plasma, or wet etching using etchant.

\* \* \* \* \*